United States Patent [19]

Tessmer et al.

[11] Patent Number: 5,300,188

[45] Date of Patent: Apr. 5, 1994

[54] PROCESS FOR MAKING SUBSTANTIALLY SMOOTH DIAMOND

[75] Inventors: Alison J. Tessmer; David L. Dreifus, both of Cary, N.C.

[73] Assignee: Kobe Development Corp., Research Triangle Park, N.C.

[21] Appl. No.: 975,817

[22] Filed: Nov. 13, 1992

[51] Int. Cl.$^5$ ............................................. H01L 21/00
[52] U.S. Cl. ..................................... 156/636; 156/645; 437/228; 437/190; 51/281 R; 51/283 R
[58] Field of Search ................. 156/636, 645; 437/228, 437/190; 51/281 R, 283 R

[56] References Cited

U.S. PATENT DOCUMENTS

| | | |
|---|---|---|
| 4,643,161 | 2/1987 | Kim . |
| 4,806,900 | 2/1989 | Fujimori et al. . |
| 4,863,529 | 9/1989 | Imai et al. ............ 148/33.4 |
| 4,925,701 | 5/1990 | Jansen et al. ............ 427/38 |
| 5,002,899 | 3/1991 | Geis et al. ............ 437/173 |
| 5,006,914 | 4/1991 | Beetz, Jr. . |
| 5,066,938 | 11/1991 | Kobashi et al. ............ 338/22 |
| 5,070,040 | 12/1991 | Pankove ............ 437/209 |
| 5,071,677 | 12/1991 | Patterson ............ 427/249 |
| 5,082,359 | 1/1992 | Kirkpatrick ............ 359/642 |
| 5,086,014 | 2/1992 | Miyata et al. ............ 437/103 |
| 5,099,296 | 3/1992 | Mort et al. . |
| 5,127,983 | 7/1992 | Imai et al. ............ 156/610 |
| 5,131,963 | 7/1992 | Ravi ............ 148/DIG. 135 |
| 5,136,344 | 8/1992 | Pronko . |
| 5,154,023 | 10/1992 | Sioshansi ............ 51/323 |
| 5,246,884 | 9/1993 | Jaso et al. ............ 437/225 |

FOREIGN PATENT DOCUMENTS 61-166041 7/1986 Japan .

OTHER PUBLICATIONS

W. E. Mutter, "Choice Stop Material for Chemical/Mechanical Polish Planarization," *IBM Tech. Disc. Bull.*, vol. 27, No. 8, Jan. 1985, p. 4642.

S. Jin et al. Massive thinning of diamond films by a diffusion process, *Appl. Phys. Lett.*, 60 pp. 1948–1950 (1992).

A. B. Harker et al., The polishing of polycrystalline diamond films, *SPIE* 1325 pp. 222–229, Jul. (1990).

Yoshikawa, Development and performance of a diamond film polishing apparatus with hot metals *SPIE* 1325 pp. 210–221 Jul. (1990).

T. Roppel et al. Thin film diamond microstructure applications, pp. 311–318 (1991).

"Thin Film Diamond Microstructure Applications," Y. Tzeng, M. Yoshikawa, M. Murakawa, A. Feldman, Ed. Elsevier Science Publishers B.V., 1991, pp. 311–318.

*Primary Examiner*—T. N. Quach
*Assistant Examiner*—Laura M. Holtzman
*Attorney, Agent, or Firm*—Bell Seltzer Park & Gibson

[57] ABSTRACT

The present invention provides a process for making a diamond layer having a substantially smooth upper surface and a predetermined thickness on a substrate. The process includes depositing a patterned polish stopping layer on a substrate to a predetermined thickness while leaving predetermined portions of the substrate exposed. A diamond layer is than deposited on the polish stopping layer and on the predetermined portions of the substrate left exposed. The diamond layer is polished down to the polish stopping layer thereby forming a diamond layer on the substrate having a thickness substantially equal to the predetermined thickness of the polish stopping layer. The polish is conducted by a method that includes the mechanical and/or chemical consumption of the diamond layer. The polish stopping layer is capable of substantially stopping the consumption of the diamond layer.

29 Claims, 5 Drawing Sheets

PROCESS FOR MAKING SUBSTANTIALLY SMOOTH DIAMOND

FIELD OF THE INVENTION

This invention relates to diamond, and more particularly to a process of making a substantially smooth diamond layer having a predetermined thickness on a substrate.

BACKGROUND OF THE INVENTION

Diamond is a preferred material for electronic devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond is also a preferred material for mechanical devices. Diamond is chemically inert and has high strength properties. Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. Diamond is also electrically insulating. In addition, diamond has a smaller neutron cross-section which reduces its degradation in radioactive environments, i.e., diamond is a "radiation-hard" material.

Because of the advantages of diamond as a material for electronic and mechanical devices, there is at present an interest in the processing of diamond. For example, diamond-based devices depending on the improved mechanical properties of diamond (e.g., detectors and sensors) have been proposed, in *Applications of Diamond Films and Related Materials*, Elsevier Science Publishers, 1991, pp. 311-319. Diamond-based devices depending on the improved electrical properties of diamond (e.g., transistors and thermistors) have been proposed, for example in U.S. Pat. Nos. 4,806,900 to Fujimori et al., 5,099,296 to Mort et al. and 5,066,938 to Kobashi et al. Many of these mechanical and electrical devices, however, require that the diamond surface be substantially smooth, and are preferably polished. Any inherent surface roughness can result in difficulty in patterning, in controlling the thickness of specific layers, and in fabricating devices.

The various current methods for polishing diamond have limitations. For example, mechanical polishing such as described in U.S. Pat. No. 4,643,161 to Kim, is sometimes difficult to control, and the resulting polished diamond layers often do not have a controlled thickness. Polishing by reaction with oxygen ion or gas often results in pitting. Various other techniques such as diffusion removal of carbon onto foil, laser ablation, argon ion-beam irradiation, hot metal lapping and electrical discharge have been used. These techniques also are sometimes difficult to control and result in diamond layers not having a controlled thickness. See, for example, *Massive Thinning of Diamond Films by a Diffusion Process*, Jin et al., Appl. Physics Letters, Vol. 60, No. 16, 1948 (1992); *Development and Performance of a Diamond Film Polishing Apparatus With Hot Metals*, Yoshikawa, SPIE Diamond Optics III, Vol. 1325, 210 (1990); and *The Polishing of Polycrystalline Diamond Films*, Harker et al., SPIE Vol. 1325 Diamond Optics III, Vol. 1325, 222 (1990).

SUMMARY OF THE INVENTION

It is therefore an object of the present invention to provide a process for providing a diamond layer having a substantially smooth surface and a predetermined and controlled thickness on a substrate.

This and other objects according to the present invention are provided by a process to make a diamond layer having a substantially smooth upper surface and having a predetermined thickness. The process includes depositing a patterned polish stopping layer on a substrate to a predetermined thickness while leaving predetermined portions of the substrate exposed. A diamond layer, preferably a semiconducting diamond device layer or an insulating diamond layer, is then deposited on the polish stopping layer and on the predetermined portions of the substrate left exposed. The diamond layer is polished down to the polish stopping layer thereby forming a diamond layer on the substrate having a thickness substantially equal to the predetermined thickness of the polish stopping layer The polish preferably is conducted by a technique that includes mechanically and/or chemically consuming the diamond layer. The polish stopping layer is capable of substantially stopping the mechanical and/or chemical consumption of the diamond layer.

The ability to polish a diamond layer to provide a substantially smooth surface while controlling the thickness of the diamond layer can be advantageous in making various microcircuit constructions such as MOS and CMOS technologies, integrated circuit families such as LSI, MSI and VLSI, and devices particularly when a substantially flat, very thin and well-defined, controlled thickness diamond layer is desired. For example in a multi-chip module, it would be desirable to bury or encapsulate a diamond layer within a diamond substrate wherein the diamond layer is a strip of conducting diamond of a controlled thickness (and controlled resistivity) and is used to make electrical contacts. Other devices include various sensors and detectors (e.g., accelerometers, flow sensors, etc.), transistors (e.g., field effect transistors), thermistors, micromachined structures (e.g., membranes, windows, motors, levers etc.), lithographic masks, and the like. See, for example, U.S. Pat. Nos. 4,806,900 to Fujimori et al., 5,099,296 to Mort et al. and 5,066,938 to Kobashi et al., the disclosures of which are incorporated herein by references.

DETAILED DESCRIPTION OF THE PREFERRED EMBODIMENTS

Figure 1A:
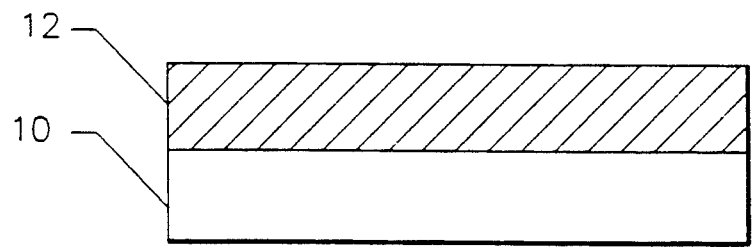
FIGS. 1A-1E are cross-sectional views schematically illustrating certain stages of an embodiment of the process of the present invention

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. In the drawings, the thickness of layers and regions are exaggerated for clarity. Like characters refer to like elements throughout.

Figure 1B:
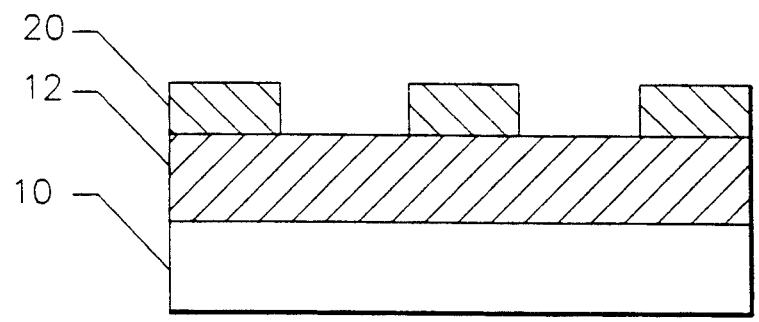
Figure 1C:
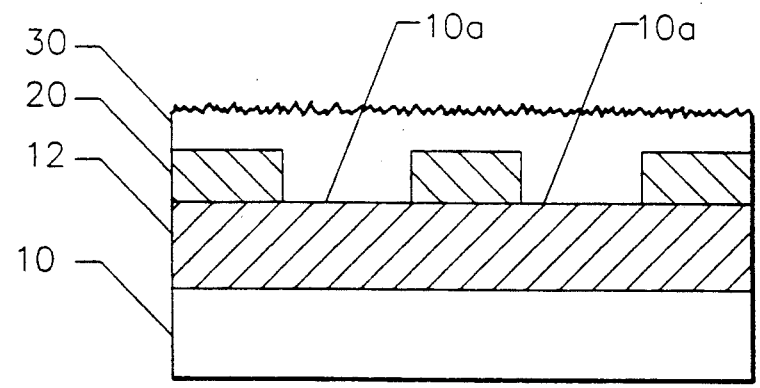
Figure 1D:
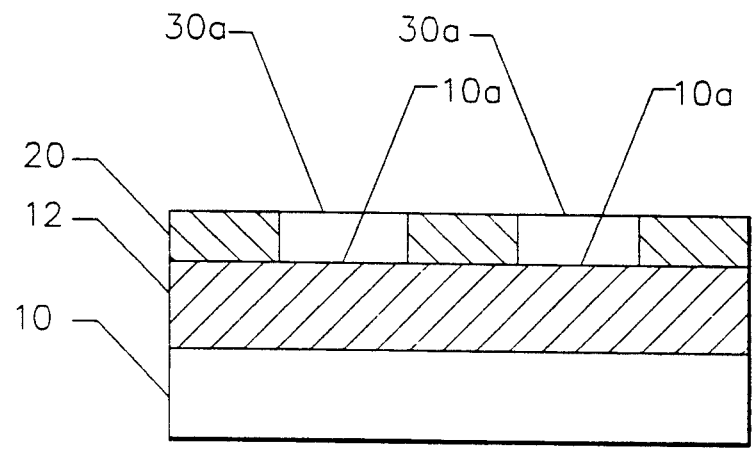

Referring to FIGS. 1A–1E, the process for making a diamond layer having a substantially smooth upper surface and having a predetermined thickness is illustrated. In FIG. 1A, a substrate 10 is provided, and as shown can include a diamond buffer layer 12. As shown in FIG. 1B, a patterned polish stopping layer 20 is deposited On the substrate 10 to a predetermined thickness while leaving predetermined portions 10a of the substrate 10 exposed. As shown in FIG. 1C, a diamond layer 30 (e.g., a semiconducting diamond device layer or an insulating diamond layer) is then deposited on the polish stopping layer 20 and on the predetermined portions 10a of the substrate 10 left exposed. As shown in FIG. 1D, the diamond layer 30 is polished down to the polish stopping layer 20 thereby providing a substantially smooth diamond layer 30a on the substrate 10 having a thickness substantially equal to the predetermined thickness of the polish stopping layer 20. Additionally, if desired the individual diamond layer 30a can have parallel faces.

The substrate 10 can be a semiconducting diamond or a non-diamond substrate. The diamond substrate can be natural, synthetic, homoepitaxial or heteroepitaxial single crystal diamond or can be polycrystalline diamond (e.g., grown by a CVD technique). Suitable non-diamond substrates include metals (e.g., titanium, molybdenum, nickel, tungsten, copper, tantalum, etc.), carbides (e.g., silicon carbide, tungsten carbide, etc.), nitrides (e.g., silicon nitride, silicon aluminum oxynitride, boron nitride), and oxides (e.g., silicon dioxide, aluminum oxide, etc.).

The diamond or non-diamond substrate 10 can have a thickness of greater than about 0.25 $\mu$m, preferably between about 0.5 $\mu$m and 1000 $\mu$m, and most preferably about 1 $\mu$m to 500 $\mu$m. Optionally, a diamond buffer layer 12 is deposited on this layer. The diamond buffer layer 12 is preferably polished and is typically a polycrystalline layer although it can be a single crystal layer, particularly if a diamond substrate is used. The diamond buffer layer 12 can have a thickness of greater than about 100 Å, preferably between about 500 Å and 250 $\mu$m, and most preferably about 0.5 $\mu$m to 25 $\mu$m.

Likewise, the diamond layer 30 can be polycrystalline or single crystal diamond. The diamond layer 30 can have a thickness of greater than about 100 Å, preferably between about 100 Å and 250 $\mu$m, and most preferably about 0.05 $\mu$m to 15 $\mu$m.

Deposition of the diamond buffer layer 12 or diamond layer 30 is typically carried out by various known techniques. For example, a chemical vapor deposition (CVD) process which relies on the thermal dissociation of a hydrocarbon gas, such as methane gas, in the presence of hydrogen and oxygen. A hot filament, microwave source, or flame is used to drive the dissociation process, causing deposition of the diamond film. Nucleation of the diamond crystals is initiated and controlled by the disbursement of nucleation causing particles on the surface to be coated by the film, thereby providing a method for patterning of the polycrystalline diamond deposits such as proposed in U.S. Pat. No. 5,099,296 to Mort et al., the disclosure of which is incorporated herein by reference. The use of other deposition techniques such as molecular beam epitaxy (MBE), sputtering, electron beam evaporation, etc. will be readily apparent to those skilled in the art.

The substrate, diamond buffer layer and/or diamond device layer can be doped using conventional doping techniques. For example, the substrate, diamond buffer layer and/or diamond device layer may be boron doped at a doping level of $10^{10}$ to $10^{20}$ atom/cm$^3$ to provide a p-type device layer depending on the desired device structure. For example in a field effect transistor (FET), a low resistance ohmic contact is desired, the substrate can be doped to form a p++ layer. Other dopants, such as those from Group IIIb may also be used. Other well-known dopants may also be used to form a n-type device layer such as phosphorus or other elements in Group VA.

The polish stopping layer 20 is a layer capable of substantially stopping the mechanical and/or chemical consumption of the diamond device layer 30 during polishing. It is recognized that the term "substantially stopping" relates to a complete stopping of polishing, but also includes substantially slowing down the consumption in a manner that can be detected or otherwise used to signal that the polishing should be discontinued. The polishing is conducted by a technique that includes mechanically and/or chemically consuming the diamond layer 30. An exemplary polishing technique and apparatus conducted by mechanically and chemically consuming the diamond device layer is proposed in U.S. Pat. No. 4,643,161 to Kim, the disclosure of which is incorporated herein by reference Generally, a rotating platen is coated with SiO$_x$ (x=1.97) and when the diamond layer being polished is rubbed on the platen, the SiO$_x$ reacts with the diamond (and its carbon) to form CO and CO$_2$ thereby removing carbon from the surface chemically in addition to the carbon being removed mechanically (e.g., by abrasion). The limitation of such a process is that the chemical reaction does not stop once the diamond surface is flat or smooth. It continues as long as there is diamond to react at the surface. Thus, in the past it has been difficult to control the thickness of the polished diamond layers resulting in difficulty in controlling the mechanical and electrical properties of the diamond device layer.

The polish stopping layer 20 is preferably a layer having a predetermined thickness of a material such as various metals, polysilicon, silicon nitride, silicon oxide or other suitable material capable of substantially stopping the consumption of diamond. For example, if the polishing technique proposed in U.S. Pat. No. 4,643,161 to Kim is used, the polish stopping layer can be utilized to stop the chemical consumption of diamond by the SiO$_x$. In another embodiment, if a hot iron scathe polishing technique is used such as described in *Development and Performance of a Diamond Film Polishing Apparatus With Hot Metals*, Yoshikawa, SPIE Diamond Optics III, Vol. 1325, 210 (1990) and *The Polishing of Polycrystalline Diamond Films*, Harker et al., SPIE Vol. 1325 Diamond Optics III, Vol. 1325, 222 (1990), the polish stopping layer can be utilized to stop both the mechanical and chemical consumption of diamond by such a technique.

As would be readily understood by those skilled in the art, the polish stopping layer can be deposited on the substrate 10 using conventional deposition techniques such as CVD, MBE, sputtering, electron beam evaporation, etc. Predetermined portions of the substrate can be left exposed using masking techniques known in the art.

Figure 1E:
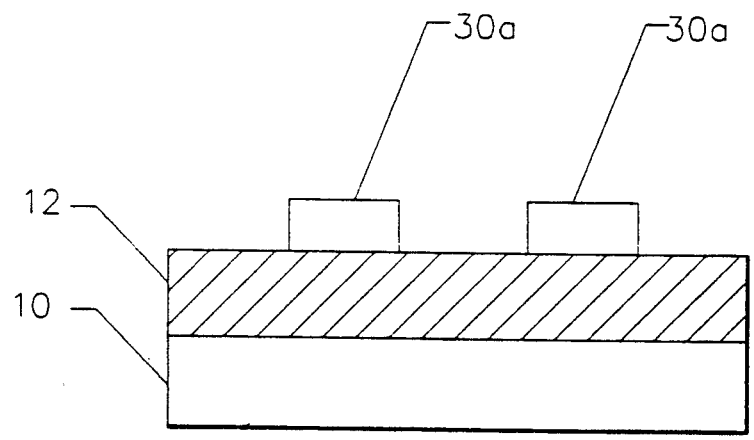

After polishing, the semiconducting diamond layer 30 has a substantially smooth upper surface and has a thickness substantially equal to the controlled predetermined thickness of the polish stopping layer 20. As shown in FIG. 1E, the polish stopping layer 20 can be etched away by commonly available etching processes, for example, those used in etching polysilicon, such as wet chemistry, plasma or reactive ion etching. If the diamond buffer layer 12 is polished, the top surface of the buffer layer is substantially parallel to the top surface of the substantially smooth diamond layer 30a. Thus multiple layers having both a uniform and controlled thickness can be obtained.

Figure 2A:
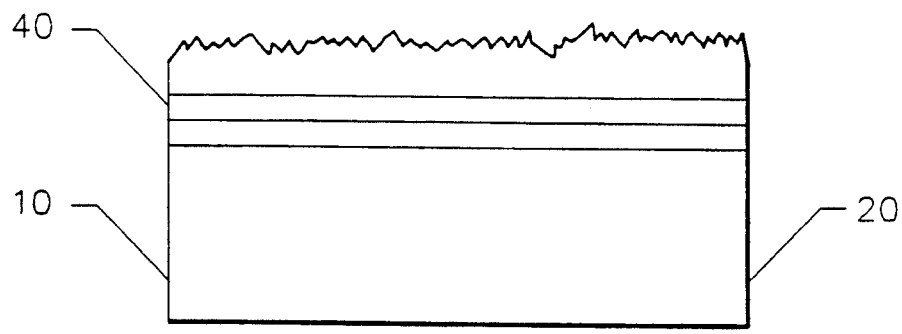
FIGS. 2A-2E are cross-sectional views schematically illustrating certain stages of another embodiment of the process of the present invention.
Figure 2B:
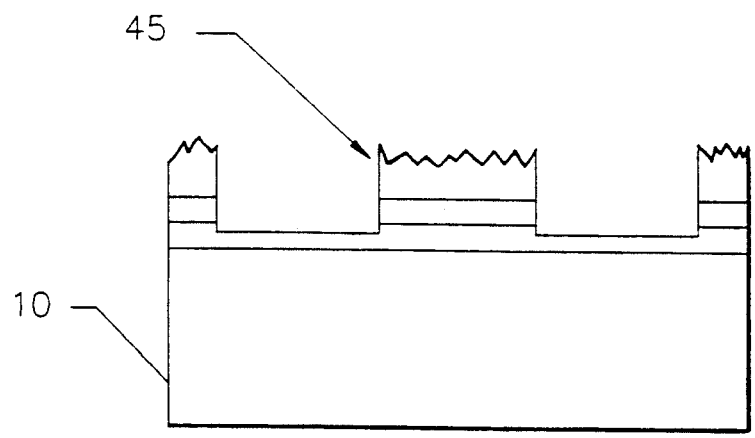

Referring to FIGS. 2A-2E, another embodiment of the present invention is illustrated. As shown in FIG. 2A, two or more layers of diamond are deposited on a substrate 10 to form a diamond multi-layer structure 40 having a first predetermined thickness. The combination of layers can have various doping levels. The surface of layers can be polished after each deposition or can be unpolished as shown. As shown in FIG. 2B, the diamond multi-layer structure 40 is etched using a conventional diamond etching technique to form a mesa structure 45. Mesa areas are patterned on the diamond samples, for example, by forming a metal (e.g., Au, Al, etc.) mask on the diamond surface. Etching is performed using ECR, electron beam assisted plasma etching (EBAPE), oxidation, or some other diamond etching technique until the desired mesa height is reached. Following etching, the metal mask is removed, leaving the diamond sample with the desired mesa patterns.

Figure 2C:
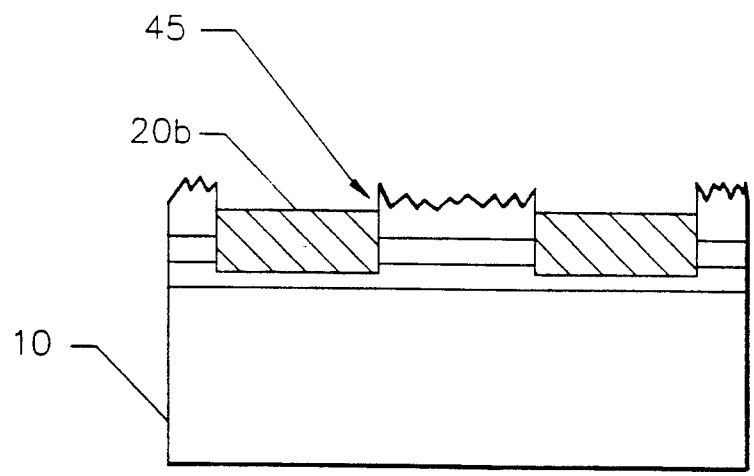
Figure 2D:
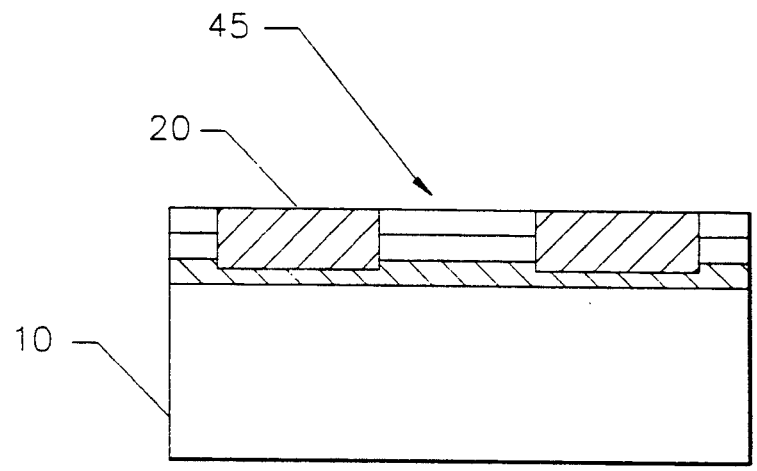
Figure 2E:
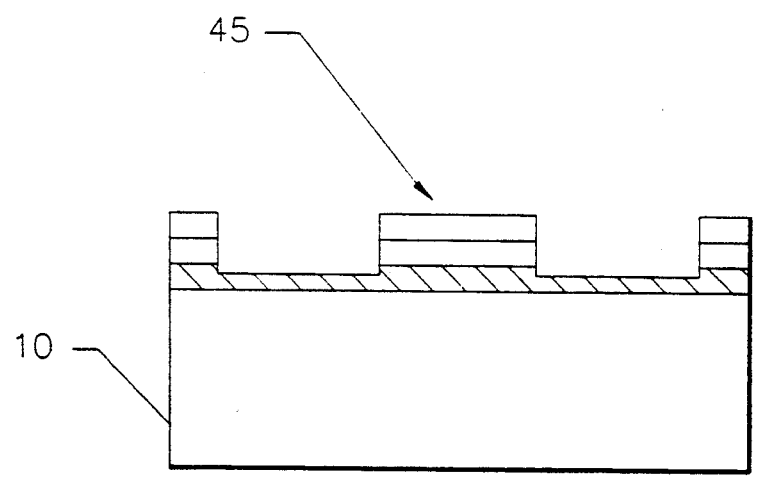

Referring to FIG. 2C, a controlled second predetermined thickness of a polish stopping layer 20b is deposited around the mesa structure 45. Polishing is conducted as shown in FIG. 2D down to the polish stopping layer 20b and the top surface of the mesa structure 45 is substantially smooth. As shown in FIG. 2D, the polished stopping layer 20b is then etched away using conventional etching techniques to provide a substantially smooth mesa structure 45 having a predetermined thickness substantially equal to the thickness of the polish stopping layer 20b.

Figure 3A:
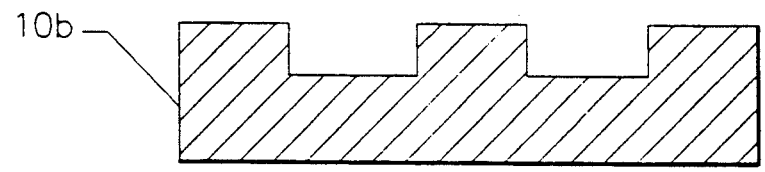
FIGS. 3A–3C are cross-sectional views schematically illustrating certain stages of still another embodiment of the process of the present invention.
Figure 3B:
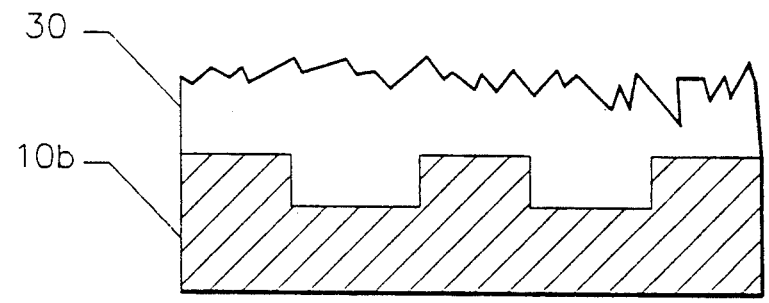
Figure 3C:
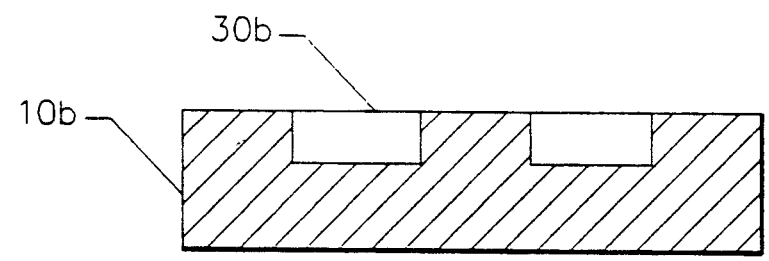

Referring to FIG. 3A-3C, another embodiment of the present invention is illustrated. A substrate 10b formed from a polish stopping material (e.g., polysilicon) is etched to provide a plurality of surface irregularities or recessed portions having a predetermined depth and in a predetermined pattern. As shown in FIG. 3B, a diamond layer 30b is deposited on the upper surface of the substrate and in contact with the recessed portions thereof. As shown in FIG. 3C, the diamond layer 30 is etched down to the upper surface of the substrate inasmuch as the substrate 10b formed from the polish stopping material stops the polishing. The diamond layer 30b is substantially planar with the upper surface of the substrate 10b and will have a thickness substantially equal to the predetermined depth of the recessed portions Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which we claim is:

1. A process of making a substantially smooth diamond layer having a thickness on a substrate comprising the steps of:
   depositing a patterned polish stopping layer on a substrate to a thickness while leaving portions of the substrate exposed;
   depositing a diamond layer on the polish stopping layer and on the portions of the substrate left exposed; and
   polishing the diamond layer down to the polish stopping layer by a method including the mechanical or chemical consumption or both of the diamond layer wherein the polish stopping layer is capable of stopping the consumption of the diamond layer to form a diamond layer on the substrate having a smooth upper surface and having a thickness equal to the thickness of the polish stopping layer.

2. The process according to claim 1 wherein the diamond layer is semiconducting diamond.

3. The process according to claim 2 wherein the diamond layer is single crystal diamond or polycrystalline diamond.

4. The process according to claim 1 wherein the diamond layer is insulating diamond.

5. The process according to claim 1 wherein the polish stopping layer is capable of stopping the chemical consumption of diamond by $SiO_x$.

6. The process according to claim 1 wherein the polish stopping layer is capable of stopping the mechanical and chemical consumption of the diamond by a hot iron scathe polishing technique.

7. The process according to claim 1 wherein the polish stopping layer is layer of a material selected from the group consisting of polysilicon, silicon nitride and silicon oxide.

8. The process according to claim 1 wherein the substrate is a non-diamond substrate.

9. The process according to claim 8 wherein the non-diamond substrate is selected from the group consisting of metals, carbides, nitrides and oxides.

10. The process according to claim 1 wherein the substrate is a diamond substrate.

11. The process of claim 1 including the additional step of removing the polish stopping layer by etching after the step of polishing.

12. A process of making a smooth multi-layer diamond structure having a thickness on a substrate comprising the steps of:
   forming two or more diamond layers on a substrate to provide a diamond multi-layer structure having a first thickness;
   etching the diamond multi-layer structure to expose portions of the substrate;
   depositing a polish stopping layer to a second thickness which is less than the first thickness of the diamond multi-layer structure; and polishing the diamond multi-layer structure down to the polish stopping layer by a method including the mechanical or chemical consumption or both of the diamond layers wherein the polish stopping layer is capable of stopping the consumption of the diamond layer to form a diamond multi-layer structure on the substrate having a smooth upper surface and having a thickness equal to the thickness of the polish stopping layer.

13. The process according to claim 12 wherein the diamond layer is semiconducting diamond.

14. The process according to claim 13 wherein the diamond layer is single crystal diamond or polycrystalline diamond.

15. The process according to claim 12 wherein the diamond layer is insulating diamond.

16. The process according to claim 12 wherein the polish stopping layer is capable of stopping the chemical consumption of diamond by $SiO_x$.

17. The process according to claim 12 wherein the polish stopping layer is capable of stopping the mechanical and chemical consumption of a hot iron scathe polishing technique.

18. The process according to claim 12 wherein the polish stopping layer is a layer of a material selected from the group consisting of polysilicon, silicon nitride and silicon oxide.

19. The process according to claim 12 wherein the substrate is a non-diamond substrate.

20. The process according to claim 19 wherein the non-diamond substrate is selected from the group consisting of metals, carbides, nitrides and oxides.

21. The process according to claim 12 wherein the substrate is a diamond substrate.

22. The process of claim 13 including the additional steps of removing the polish stopping layer by etching after the step of polishing.

23. A process of making a smooth diamond layer having a thickness on a substrate comprising:
providing a generally planar substrate formed from a polish stopping material;
etching the substrate formed from a polish stopping material to provide a plurality of recessed portions having a depth;
depositing a diamond layer on the substrate and the recessed portions thereof; and
polishing the diamond layer down to the upper surface of the substrate by a method including the mechanical or chemical consumption or both of the diamond layer wherein the substrate formed from the polish stopping material is capable of stopping the consumption of the diamond layer to form a diamond layer on the substrate having a smooth upper surface and planar with the substrate.

24. The process according to claim 23 wherein the polish stopping material of the substrate is selected from the group consisting of polysilicon, silicon nitride and silicon oxide.

25. The process according to claim 23 wherein the diamond layer is semiconducting diamond.

26. The process according to claim 23 wherein the diamond layer is single crystal diamond or polycrystalline diamond.

27. The process according to claim 23 wherein the diamond layer is insulating diamond.

28. The process according to claim 23 wherein the polish stopping layer is capable of stopping the chemical consumption of diamond by $SiO_x$.

29. The process according to claim 23 wherein the polish stopping layer is capable of stopping the mechanical and chemical consumption of the diamond by a hot iron scathe polishing technique.

* * * * *

UNITED STATES PATENT AND TRADEMARK OFFICE
CERTIFICATE OF CORRECTION

PATENT NO. : 5,300,188
DATED : April 5, 1994
INVENTOR(S) : Tessmer et al.

It is certified that error appears in the above-identified patent and that said Letters Patent is hereby corrected as shown below:

Claim 22, column 8, line 1, please delete the numeral "13" and insert the numeral —12—.

Signed and Sealed this

Twenty-sixth Day of July, 1994

Attest:

BRUCE LEHMAN

*Attesting Officer*  *Commissioner of Patents and Trademarks*